United States Patent
Pfiffner

Patent Number: 5,739,693
Date of Patent: Apr. 14, 1998

[54] METHOD FOR DETECTING GROUND FAULTS ON THE CONDUCTORS OF AN ELECTRICAL MACHINE

[75] Inventor: Michael Pfiffner, Bonstetten, Switzerland

[73] Assignee: Asea Brown Boveri AG, Baden, Switzerland

[21] Appl. No.: 299,301

[22] Filed: Sep. 1, 1994

[30] Foreign Application Priority Data

Sep. 1, 1993 [DE] Germany ............... 43 29 381.6

[51] Int. Cl.⁶ .................. G01K 31/34; H02H 7/06
[52] U.S. Cl. ............... 324/509; 324/772; 324/547; 361/30
[58] Field of Search ................. 324/509, 772, 324/551, 547; 361/21, 30, 47

[56] References Cited

U.S. PATENT DOCUMENTS

| | | | |
|---|---|---|---|
| 3,657,555 | 4/1972 | Hoffman | 324/772 |
| 3,678,377 | 7/1972 | Chiffert | 324/547 |
| 3,934,194 | 1/1976 | Paprocki | 324/547 |
| 4,151,460 | 4/1979 | Seese et al. | 324/509 |
| 4,224,652 | 9/1980 | Fiorentzis | 324/772 |
| 4,789,817 | 12/1988 | Asakura et al. | 361/21 |
| 4,916,402 | 4/1990 | Kouan et al. | 324/547 |
| 5,473,497 | 12/1995 | Beatty | 361/30 |
| 5,508,620 | 4/1996 | Pfiffner | 324/772 |

OTHER PUBLICATIONS

H. Ungrad; Schutztechnik in Elektroenergiesystemen. Springer–Verlag Berlin, Heidelberg u. s., 1991, S.211–215.

*Primary Examiner*—Maura K. Regan
*Attorney, Agent, or Firm*—Oblon, Spivak, McClelland, Maier & Neustadt, P.C.

[57] ABSTRACT

A method is specified for detecting ground faults on the conductors of an electrical machine, in which method the conductors of the machine are biased with respect to ground by means of an injection voltage (Ui). An optimum utilization of the injection transformer (5) is achieved when the injection signal (Ui) comprises in the transmission period (S) a square-wave signal which switched over periodically between a positive and a negative maximum and has at the start and at the end of the transmission period (S) a quarter-period either of the positive or of the negative maximum.

10 Claims, 3 Drawing Sheets

METHOD FOR DETECTING GROUND FAULTS ON THE CONDUCTORS OF AN ELECTRICAL MACHINE

BACKGROUND OF THE INVENTION

1. Field of the Invention

The invention relates to the field of protective relaying.

It proceeds from a method for detecting ground faults on the conductors of an electrical machine.

2. Discussion of Background

Such a method is described, for example, in the equipment description "100% stator and rotor ground-fault protection for large GIX 104 generators" ABB Relays AG, Baden. A related method is described in the equipment description "100% generator/stator ground-fault protection GIX 103" from the same company.

Ground faults occur in an electrical machine, in particular in generators of relatively high output, chiefly due to mechanical damage to the insulation between the conductors and iron parts. Such ground faults cause the flow of a fault current whose magnitude assumes different values depending on the type of fault. Given a known voltage, a fault resistance can be determined therefrom using Ohm's law, the magnitude of which can be used to assess the fault. In the normal case, the fault resistance has values in the region of MΩ, while in the event of faults it can drop to values which are smaller by orders of magnitude.

Since the star point in the conductors, for example of the stator, connected in star is de-energized by definition, a fault can be detected in the vicinity of the star point only if the conductors are biased with respect to ground potential. This is performed in the case of two known protective devices and methods by means of a low-frequency voltage which is fed into the conductors.

A small current thus flows to ground during operation through the ground capacitances of the conductors. In the event of a ground fault, these capacitances are short circuited, and the current becomes larger than during operation in the absence of ground faults.

Use is made in the case of GIX103 of an injection signal as described in the book "Schutztechnik in Elektroenergiesystemen (Protective Relaying in Electrical Power Systems") pages 211 ff, by H. Ungrad et al., Springer Verlag. This is a square-wave signal which switches over during 3.25 periods from a positive value to a negative value. It begins with a positive quarter-period and ends with a positive half-period. This signal is fed into the conductors via an injection transformer. The magnetic flux in the injection transformer is proportional to the integral of the injection signal Ui. In the case of the signal according to the prior art, the half-period produces at the end of the injection signal a flux which does not vanish at the end of the transmission period. As a result, the initial condition for the next injection phase is greater than zero, and excessive transient reactions of the flux occur, with the result that saturation occurs in the injection transformer and the injection transformer has to be overdimensioned.

SUMMARY OF THE INVENTION

Accordingly, one object of this invention is to provide a novel method and a novel device for detecting ground faults on the conductors of an electrical machine, in which the injection transformer is utilized optimally.

This object is achieved in a method of the type mentioned at the beginning by means of the features of the first claim.

Thus, the core of the invention is that the injection signal represents a square-wave signal which is periodically switched over between a positive and a negative maximum and has at the start and at the end of the transmission period a quarter-period either of the positive or of the negative maximum.

Due to these two quarter-periods at the start and at the end of the transmission period, the integral of the injection signal, which is, after all proportional to the flux, is immediately in the steady state, that is to say a triangular signal is formed which starts and stops again at zero. The magnetic flux is thus likewise already in the steady state at the start of the transmission period. This circumstance has a particularly positive significance in the case of the dimensioning of the injection transformer, because it is possible to transmit the maximum voltage-time area without the occurrence of saturation. The utilization of the transformer is thus optimal and the transformer need not be overdimensioned.

It is now possible for the injection signal to be started or ended with two quarter-periods either of the same sign or of different sign. These two variants represent two embodiments.

Both embodiments are distinguished by the fact that the injection signal is formed from a product of two square-wave signals. The first square-wave signal switches over symmetrically between a positive and a negative value at the frequency f1 of the injection signal. The second square-wave signal has, for example, a frequency of f2=f1/8 or f2=f1/7 and switches over between a positive value and zero. In addition, it has a phase shift of 1/(4*f1) with respect to the first square-wave signal. Multiplying the two square-wave signals produces the desired injection signal.

The method according to the invention is used advantageously in three-phase machines, in particular in generators of high output. However, it can also be used in parallel with a generator in transformers grounded with high resistance.

Further exemplary embodiments follow from the subclaims.

The advantage of the design according to the invention consists, in particular, in that the injection transformer need not be unnecessarily overdimensioned for transmitting the injection signal, but can be optimally utilized.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1A:
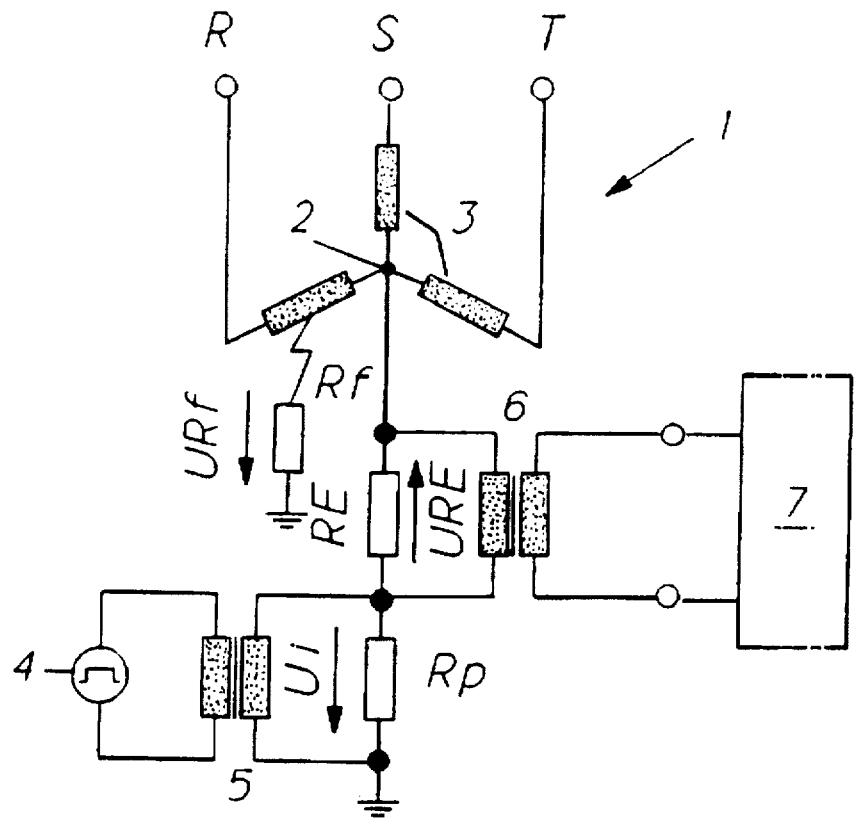
FIGS. 1a, b show the principle circuit arrangement for ground-fault detection at the stator (a) and rotor (b), respectively, of three-phase machine.

The reference signals used in the drawings are listed in summary together with their significance in the list of designations.

DESCRIPTION OF THE PREFERRED EMBODIMENTS

Referring now to the drawings, wherein like reference numerals designate identical or corresponding parts throughout the several views, FIG. 1a shows the principle of the circuit arrangement for detecting ground faults on the stator windings (R,S,T) of an electrical machine, in particular a three-phase machine. In order for it to be possible to detect ground faults on the entire winding, the star point of the winding is biased by means of an injection signal (Ui). This injection signal (Ui) is generated in an injection signal source (4) and fed into the star point (2) via an injection transformer (5) and a grounding resistance (RE). In order to detect ground faults, the voltage (URE) across the grounding resistance (RE) is measured and fed to an evaluation unit (7) via a measuring transformer (6). The fault resistance (Rf) is calculated in the evaluation unit (7) with the aid of the injected (Ui) and the measured voltage (URE).

Figure 1B:
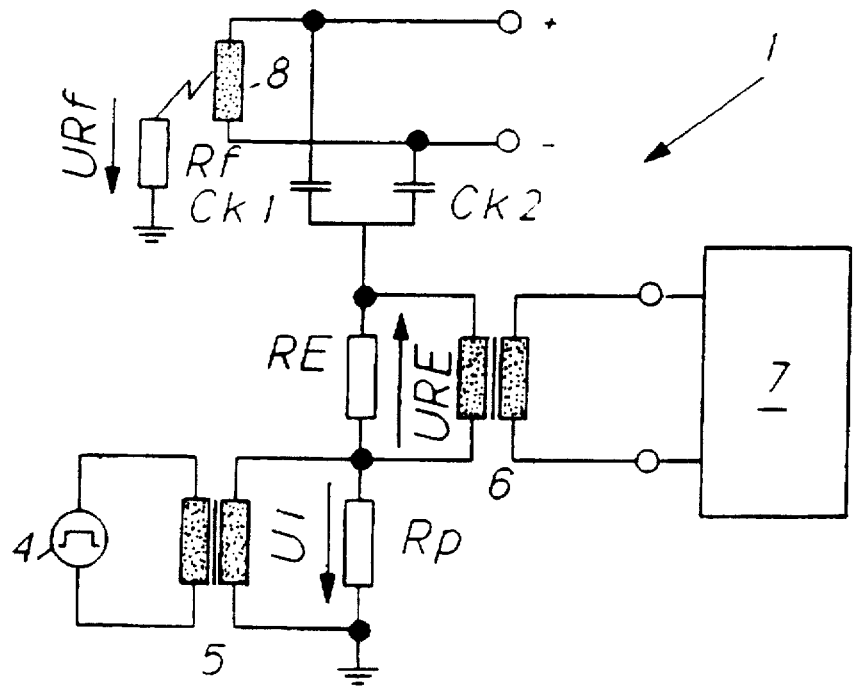

The conditions are not substantially different in the case of the rotor. There is only the possible addition of two coupling capacitors (Ck1, Ck2). FIG. 1b shows the appropriate circuit diagram.

Figure 2:
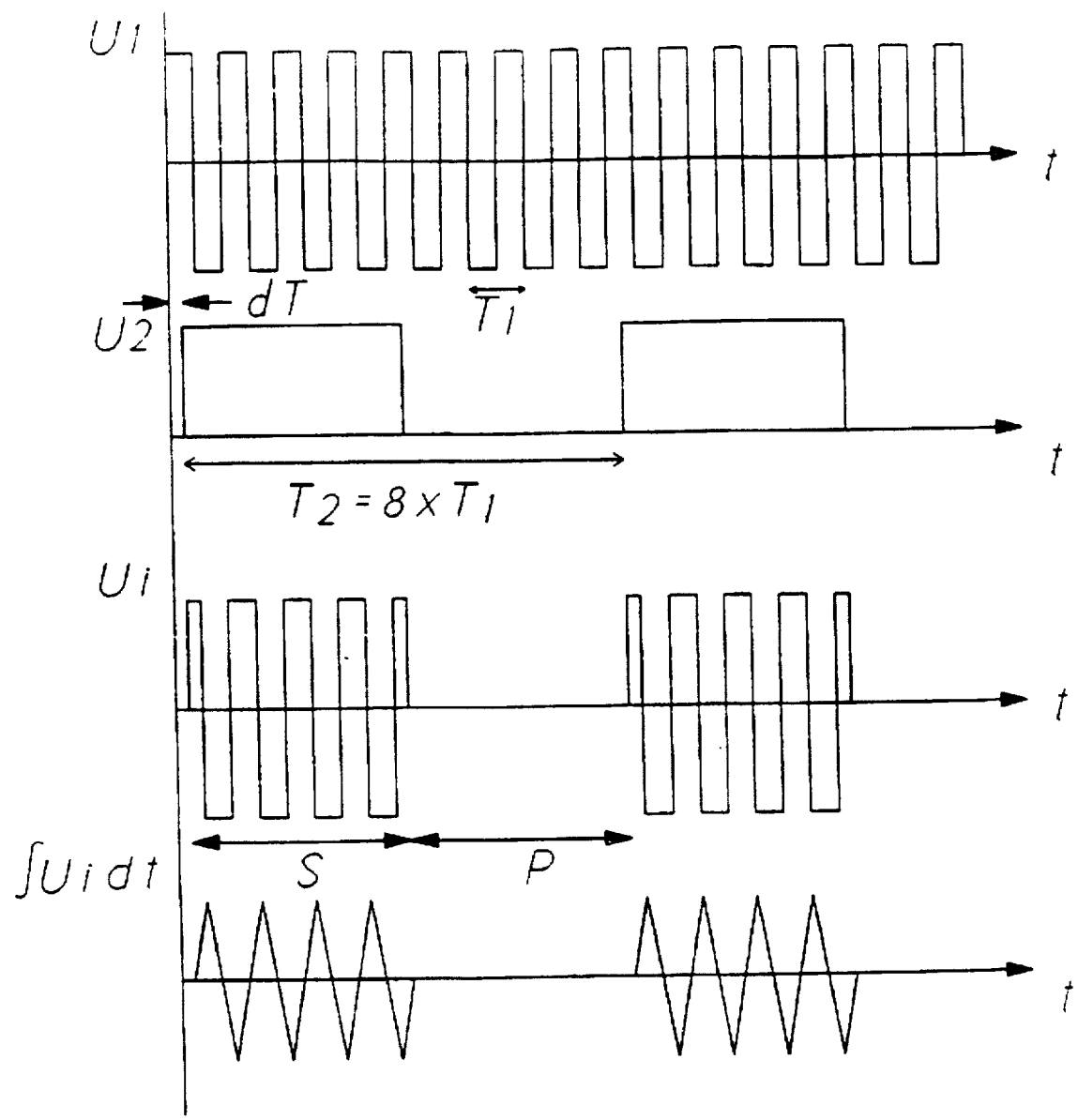
FIG. 2 shows the curve and the generation of the injection voltage and the integral thereof in accordance with a first exemplary embodiment.
Figure 3:
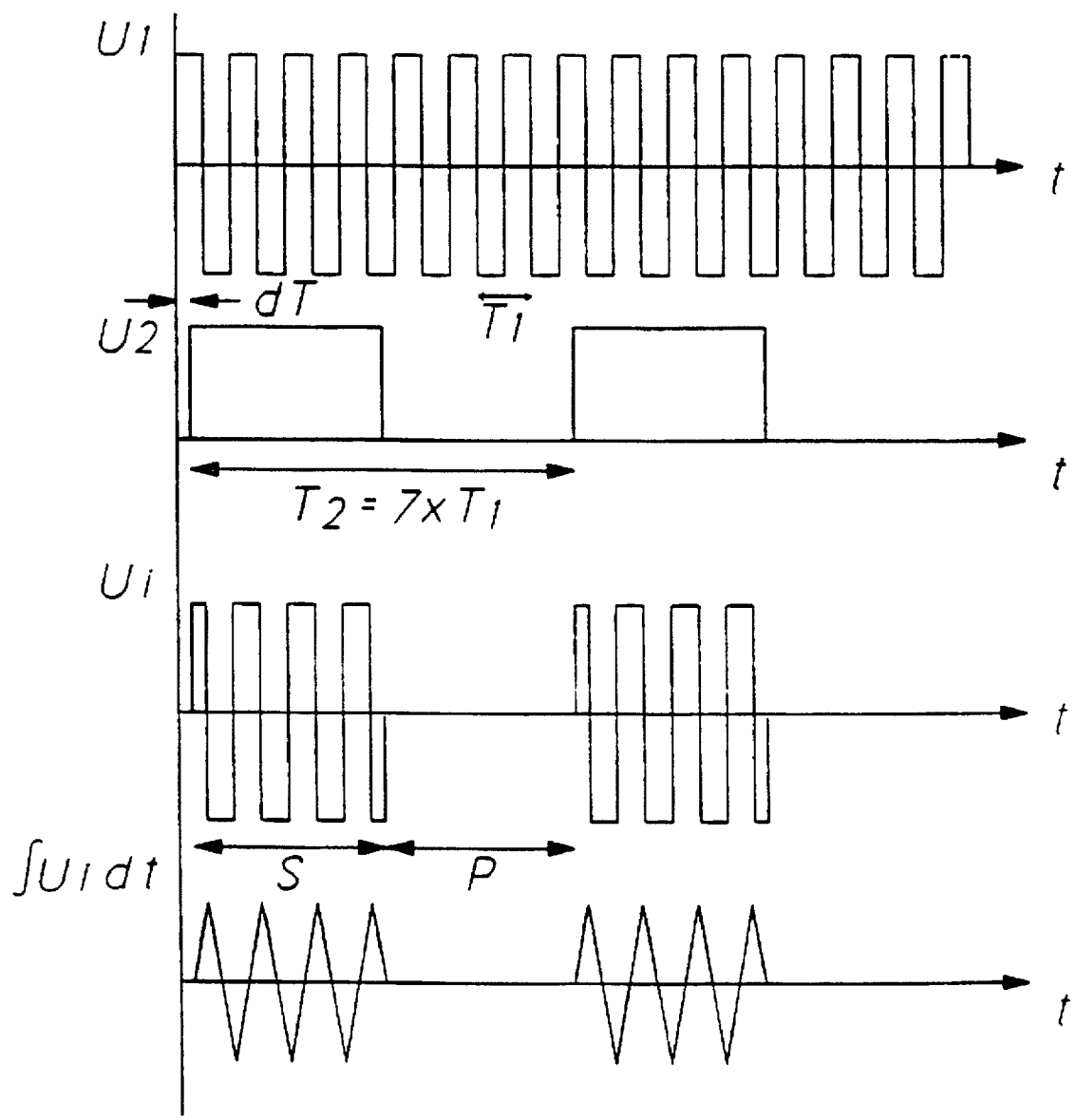
FIG. 3 shows the curve and the generation of the injection voltage and of the integral thereof in accordance with a second exemplary embodiment.

The shape and the type of the generation of the injection signal (Ui) is essential to the invention (FIGS. 2 and 3). It is known from the prior art that the injection signal (Ui) is to have a transmission period (S) on the one hand and a pause period (P) on the other hand. This renders it possible to examine the system in the pause for other signals of the injection frequency (f1). This enables a distinction to be made between transient or other disturbing signals and the useful signals, and helps in preventing false tripping of the protective system.

During the transmission period (S), the injection signal (Ui) now advantageously has a quarter-period both at the start and at the end. As a result, the integral, that is to say the flux is in the steady state, from the beginning on and also ends with zero. Consequently, no saturation can occur in the injection transformer, and the transformer also need not be dimensioned for relatively large fluxes. In other words, it can be optimally utilized.

A first embodiment (FIG. 2) is distinguished in that the injection signal has a quarter-period of the same sign both at the start and at the end.

In a second embodiment (FIG. 3), the signs are opposite.

It is common to the two exemplary embodiments that the injection signals are formed most simply by means of multiplication of two square-wave signals. In both cases, the starting point is a symmetrical square wave (U1) of frequency f1 of the injection signal (Ui). This wave is now multiplied by a second square-wave signal (U2) of frequency f2, the frequency f2 being a fraction (f1/n) of the frequency f1, n being even or odd. The frequency f2=f1/8 or f2=f1/7 is particularly preferred. This square-wave signal (U2) switches in this case only from zero to a positive value, and in addition has a phase shift (dT) of 1/(4*f1) with respect to the injection signal.

Multiplying the two square-wave signals (U1, U2) yields an injection signal (Ui) which has the desired variation during the transmission period (S) and, in addition, is correctly divided into the transmission period (S) and pause period (P).

The variants of the injection signal which have been described above are, of course, not limited to applications in ground-fault detecting devices, but are applied with advantage wherever square-wave signals are to be transmitted via a transformer.

Overall, the signal shapes according to the invention provide a method for detecting ground faults on the conductors of an electrical machine in which the injection transformer is optimally utilized.

Obviously, numerous modifications and variations of the present invention are possible in light of the above teachings. It is therefore to be understood that within the scope of the appended claims, the invention may be practised otherwise than as specifically described herein.

What is claimed as new and desired to be secured by Letters Patent of the United States is:

1. A method for detecting ground faults on the conductors of an electrical machine, comprising the steps of:

a) biasing said conductors with respect to a ground potential by means of a low-frequency injection voltage signal Ui of frequency f1, the injection signal Ui having a transmission period S and a pause period P, wherein said step of biasing includes the step of:

b) selecting for the injection signal Ui in the transmission period S a square-wave signal which is switched over periodically between a positive and a negative maximum and has at the start and at the end of the transmission period S a quarter-period either of the positive or of the negative maximum.

2. The method as claimed in claim 1, wherein said injection signal Ui is selected to have a positive quarter-period both at the start and at the end of the transmission period S.

3. The method as claimed in claim 1, wherein said injection signal Ui is selected to have a positive quarter-period at the start of the transmission period S and a negative quarter-period at the end.

4. The method as claimed in claim 2 further comprising the step of composing said injection signal Ui of the product of a first square-wave signal U1, which is of frequency f1 and is switched over symmetrically about zero to a first, positive or negative value, and a second square-wave signal U2 which is of frequency f2=f1/n, n being even or odd, which is switched between a second, positive value and zero and has a phase shift dT of 1/(4*f1) with respect to said first signal U1.

5. The method as claimed in claim 3, further comprising the step of composing said injection signal Ui of the product of a first square-wave signal U1, which is of frequency f1 and is switched over symmetrically about zero to a first, positive or negative value, and a second square-wave signal U2 which is of frequency f2=f1/n, n being even or odd, which is switched between a second, positive value and zero and has a phase shift dT of 1/(4*f1) with respect to said first signal U1.

6. The method as claimed in claim 4, wherein the frequency f2 of the second square-wave signal U2 is selected to be f1/8, n thus being equal to 8.

7. The method as claimed in claim 5, wherein the frequency f2 of the second square-wave signal U2 is selected to be f1/8, n thus being equal to 8.

8. The method as claimed in claim 4, wherein the frequency f2 of the second square-wave signal U2 is selected to be f1/7, n thus being equal to 7.

9. The method as claimed in claim 1, wherein the frequency f1 of the injection signal U1 is selected to be a quarter of the nominal frequency.

10. The method as claimed in claim 1, wherein the electrical machine is a three-phase machine, in particular a generator.

* * * * *